(12) United States Patent
Schöning et al.

(10) Patent No.: US 12,179,789 B2
(45) Date of Patent: Dec. 31, 2024

(54) METHOD FOR DEVELOPING VEHICLE FUNCTIONS AND MOTOR VEHICLE

(71) Applicant: Volkswagen Aktiengesellschaft, Wolfsburg (DE)

(72) Inventors: Volkmar Schöning, Wedemark (DE); Frank Husemann, Cremlingen (DE)

(73) Assignee: VOLKSWAGEN AKTIENGESELLSCHAFT, Wolfsburg (DE)

( * ) Notice: Subject to any disclaimer, the term of this patent is extended or adjusted under 35 U.S.C. 154(b) by 218 days.

(21) Appl. No.: 17/842,209

(22) Filed: Jun. 16, 2022

(65) Prior Publication Data

US 2022/0402519 A1 Dec. 22, 2022

(30) Foreign Application Priority Data

Jun. 16, 2021 (DE) ...................... 10 2021 206 169.9

(51) Int. Cl.
*B60W 60/00* (2020.01)
*B60W 40/02* (2006.01)
*B60W 50/00* (2006.01)

(52) U.S. Cl.
CPC ............ *B60W 60/00* (2020.02); *B60W 40/02* (2013.01); *B60W 2050/0062* (2013.01); *B60W 2556/45* (2020.02)

(58) Field of Classification Search
CPC ................. B60W 60/00; B60W 40/02; B60W 2050/0062; B60W 2556/45

(Continued)

(56) References Cited

U.S. PATENT DOCUMENTS 7,590,768 B2 * 9/2009 Gormley ............ G05B 19/0421
 710/5
10,223,842 B1 3/2019 Lee et al.
(Continued)

FOREIGN PATENT DOCUMENTS

DE 102016009655 A1 4/2017 ............... G06N 3/02
DE 102016015401 A1 7/2017 ............. B60R 16/02
(Continued)

OTHER PUBLICATIONS

Wishart, Jeffrey et al., "Literature of Verification and Validation Activities of Automated Driving Systems," SAE International Journal of Connected and Automated Vehicles, Bd. 3, No. 4, pp. 267-323, Mar. 31, 2020.
(Continued)

*Primary Examiner* — Krishnan Ramesh
(74) *Attorney, Agent, or Firm* — Slayden Grubert Beard PLLC

(57) ABSTRACT

The disclosure relates to a method for developing a vehicle function to be executed by means of hardware of a motor vehicle. The method may comprise: identifying a vehicle function to be developed; creating a design for the vehicle function; carrying out a first permissibility check on the design for the vehicle function; approving the design for the vehicle function if first permissibility criteria are met; transmitting the design for the vehicle function; carrying out a second permissibility check on the design for the vehicle function; approving the design for the vehicle function if second permissibility criteria are met; transmitting the design for the vehicle function to the motor vehicle; and implementing the vehicle function in the motor vehicle.

20 Claims, 3 Drawing Sheets

(58) Field of Classification Search
USPC .......................................................... 701/23
See application file for complete search history.

(56) References Cited

U.S. PATENT DOCUMENTS

| | | | | |
|---|---|---|---|---|
| 11,358,519 | B2* | 6/2022 | Harada | .................. G06V 20/56 |
| 11,643,114 | B2* | 5/2023 | Suzuki | ............ B60W 60/00253 |
| | | | | 701/26 |
| 2004/0225415 | A1* | 11/2004 | Newberry | ........... G06F 15/7867 |
| | | | | 701/1 |
| 2015/0293504 | A1* | 10/2015 | Blum | ..................... H05B 47/12 |
| | | | | 700/90 |
| 2017/0106738 | A1* | 4/2017 | Gillett | .................. B62K 11/007 |
| 2020/0033869 | A1 | 1/2020 | Palanisamy et al. | |
| 2020/0327340 | A1 | 10/2020 | Jackobson et al. | |
| 2021/0116907 | A1 | 4/2021 | Altman | |
| 2021/0229690 | A1* | 7/2021 | Merfels | ............... B60W 30/143 |
| 2022/0194433 | A1* | 6/2022 | Nagata | ................. G08G 1/0969 |
| 2023/0083098 | A1* | 3/2023 | Kato | ................. B60W 60/0059 |
| | | | | 701/23 |

FOREIGN PATENT DOCUMENTS

| | | | | |
|---|---|---|---|---|
| DE | 102017221727 A1 | 5/2019 | ............ B60W 40/12 |
| DE | 102019113880 A1 | 1/2020 | ............ B60W 50/00 |
| EP | 3748454 A1 | 12/2020 | ............ B60W 60/00 |
| IN | 201811025275 A | 6/2018 | ............. G06F 1/163 |
| WO | 2018/119423 A1 | 6/2018 | ............. B60R 11/04 |
| WO | 2019/241307 A2 | 12/2019 | ............ B60W 30/14 |

OTHER PUBLICATIONS

Extended European Search Report, Application No. 22174696.9, 9 pages, Dec. 5, 2022.
German Office Action, Application No. 102021206169.9, 6 pages, Dec. 3, 2021.

* cited by examiner

METHOD FOR DEVELOPING VEHICLE FUNCTIONS AND MOTOR VEHICLE

CROSS-REFERENCE TO RELATED APPLICATIONS

This application claims priority to German Patent Application No. DE 10 2021 206 169.9, filed on Jun. 16, 2021 with the German Patent and Trademark Office. The contents of the aforesaid Patent Application are incorporated herein for all purposes.

TECHNICAL FIELD

The present invention relates to a method for developing a vehicle function to be executed by means of hardware of a motor vehicle. The invention further relates to a motor vehicle that is designed to carry out the motor vehicle-side method steps of the method.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

It is known that artificial intelligence (AI) is increasingly being used in many areas of technology. AI is continuously gaining importance in the automotive industry as well. In this sector, AI is used both within the scope of product development and manufacturing and in the finished product.

AI is also referred to in specialist circles as "artificial intelligence", or "AI" for short, and is a branch of computer science that relates to the automation of intelligent behavior as well as machine learning. AI refers, for example, to the representation of human behavior on a machine, with the aim of solving problems autonomously and without intervention on the part of a human.

In so-called autonomous motor vehicles, AI takes over driving functions such as steering, accelerating, or braking. As such, the motor vehicle can be controlled by means of AI on the basis of navigation data, calendar entries, or the like to a destination. In addition, other vehicle functions can be taken over by AI, for example, indicating, lighting, windscreen wiping, ventilation, seatbelt tensioning, or the like. An autonomous motor vehicle is known, for example, from WO 2019/241307 A2.

Known systems for operating motor vehicles using AI have the disadvantage that decisions about modifying vehicle functions can be made autonomously and merely in consideration of predefined rules or, alternatively, limits. In extreme cases, such a high level of autonomy for the AI can lead to unforeseen interactions between components of the motor vehicle and thus to faults caused thereby. Moreover, in particular in the case of limits that have been set too wide, unchecked intervention on the part of the AI in the driving behavior of the motor vehicle can result in homologation-relevant changes to the motor vehicle, which can result in the motor vehicle losing its registration. Limits that are set too narrow generally result in the AI not being able to exploit its potential and only minor, often barely noticeable changes to vehicle functions can be effected. Moreover, known systems leave the operator as well as the developers of the motor vehicle uncertain as to the type of interventions performed. As such, any undesirable developments in a self-learning system can often only be identified after a significant delay.

SUMMARY

A need exists to overcome or at least partially overcome the above-described disadvantages in a motor vehicle. In particular, a need may exist to provide a method for developing a vehicle function to be executed by means of hardware of a motor vehicle as well as to provide a motor vehicle, which method and motor vehicle reduce the risk of faulty vehicle functions being implemented and/or facilitate development of vehicle functions in a simple and cost-effective manner.

The need is addressed by the claims. The need is addressed by a method for developing a vehicle function to be executed using hardware of a motor vehicle having the features of independent method claim and by a motor vehicle having the features of the independent apparatus claim.

Other features, embodiments, and details of the disclosure are apparent from the dependent claims, the description, and the drawings. Features, embodiments, and details that are described in association with the method of this disclosure may also refer to the motor vehicle of this disclosure and vice versa.

Therefore, mutual reference is made with regard to the disclosure of the individual aspects, features, embodiments, and details of this disclosure.

DESCRIPTION

Figure 1:
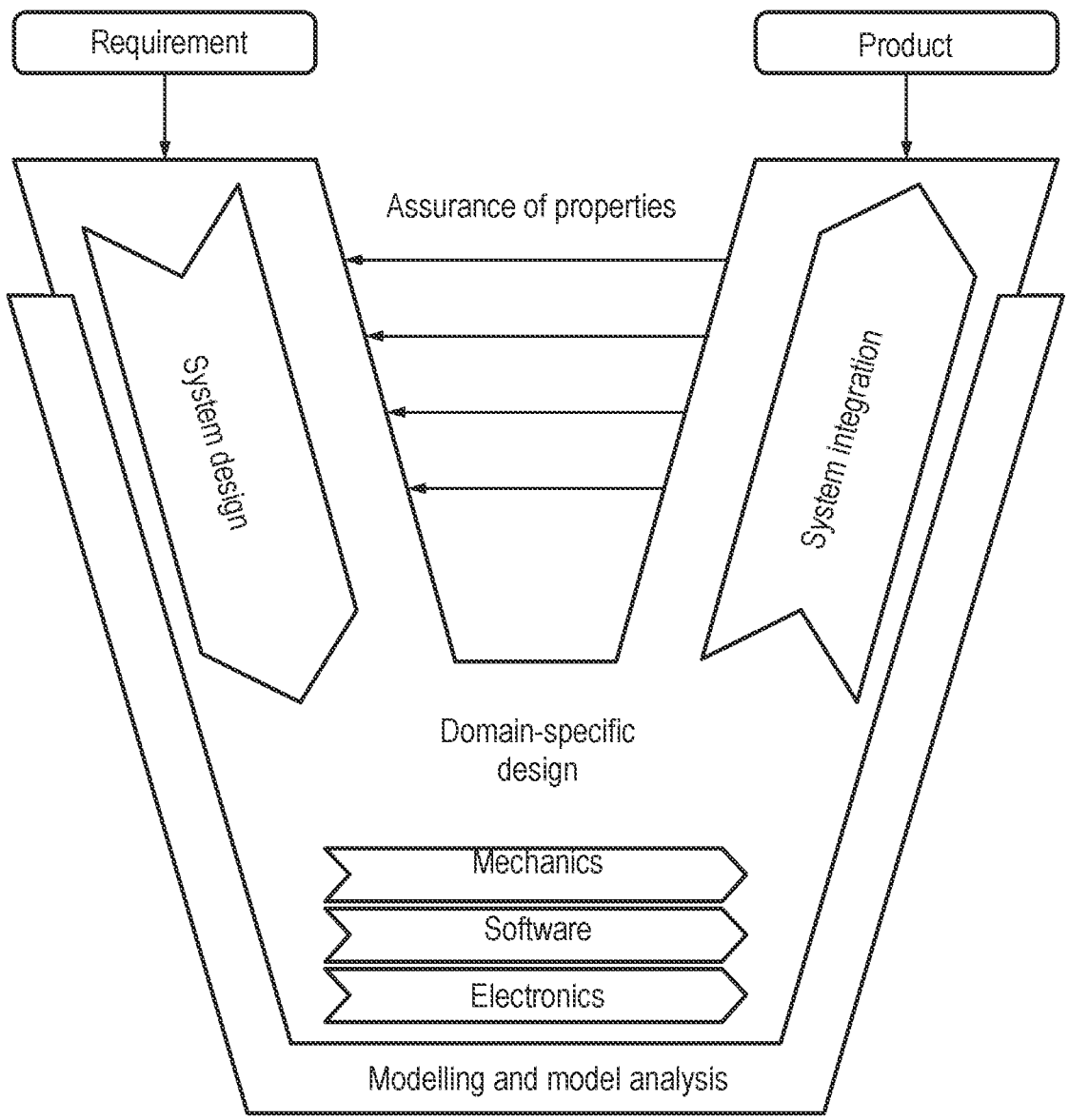
FIG. 1 schematically shows a V-model according to VDI 2206.

The details of one or more embodiments are set forth in the accompanying drawings and the description below. Other features will be apparent from the description, drawings, and from the claims.

In the following description of embodiments of the invention, specific details are described in order to provide a thorough understanding of the invention. However, it will be apparent to one of ordinary skill in the art that the invention may be practiced without these specific details. In other instances, well-known features have not been described in detail to avoid unnecessarily complicating the instant description.

According to some embodiments, a method for developing a vehicle function to be executed by means of hardware of a motor vehicle is provided. The method comprises:
identifying a vehicle function to be developed by means of a development circuit of the motor vehicle, wherein the development circuit comprises artificial intelligence,
creating a design for the vehicle function by means of the development circuit,
carrying out a first permissibility check on the design for the vehicle function based on predefined first permissibility criteria by means of the development circuit, approving the design for the vehicle function for transmission by means of the development circuit if the first permissibility criteria are met, transmitting the design for the vehicle function to a checking circuit that is remote from the motor vehicle by means of a first data transmission interface of the motor vehicle, carrying out a second permissibility check on the design for the vehicle function based on predefined second permissibility criteria by means of the checking circuit, approving the design for the vehicle function for transmission by means of the checking circuit if the second permissibility criteria are met, transmitting the approved design for the vehicle function to the motor vehicle by means of a second data transmission interface, and implementing the vehicle function in the motor vehicle by means of the development circuit.

The development circuit of the motor vehicle may in some embodiments identify the vehicle function of the motor vehicle to be developed by means of its artificial intelligence. For this purpose, an operating situation of the motor vehicle is for example analyzed in an analysis method. Sensor data from sensors of the motor vehicle are for example evaluated in order to determine the operating situation. One or more vehicle functions to be developed are identified as the result of the analysis. Within the context of this disclosure, "developing vehicle functions" should, for example, be understood to mean recreating as well as improving already existing vehicle functions.

A vehicle function is a technical function that may for example be realized by means of the hardware of the motor vehicle, for example targeted illumination of a region arranged ahead of a front side of the motor vehicle by means of a lighting device of the motor vehicle. A variety of different lighting aspects may be considered here, for example illuminating a curve, preventing other road users from being dazzled, preventing reflections, for example caused by puddles, fog, or precipitation, highlighting particular instructions or hazards by means of targeted spotlighting, or the like. For example, according to the present disclosure, the development circuit may ascertain that the driver frequently does not comply with a speed limit and, based on this, can identify the vehicle function of highlighting corresponding road signs by means of the lighting device. Likewise, the development circuit may identify the benefit of illuminating a curve by means of an additional lighting device, for example a fog light, high beam, laser, or the like. In this case, the development of the vehicle function may also include using the motor vehicle hardware to be used in a new way, for example selectively actuating only one fog light or part of the fog light. Here, it is initially irrelevant as to whether the corresponding hardware is provided or, alternatively, configured for such an application.

The development circuit then may create the design for the vehicle function. The design for the vehicle function for example has all motor vehicle operating parameters that are relevant to executing the vehicle function. For example, the development circuit simulates the operation of the hardware for realizing the vehicle function.

Furthermore, the development circuit carries out the first permissibility check on the design for the vehicle function based on the predefined first permissibility criteria. For this purpose, the development circuit comprises the artificial intelligence. The first permissibility criteria may, for example, relate to laws, industrial property rights, for example patents, regulations, for example manufacturer specifications or development guidelines, provisions, for example official authorization provisions, functional safety requirements, aspects requiring documentation, homologation-related regulations, ethical principles, or the like.

If, during the first permissibility check, the development circuit comes to the conclusion that the design for the driving function meets the first permissibility criteria, said circuit approves the design. The design for the vehicle function is forwarded by means of the first data transmission interface to the checking circuit, which is remote from the motor vehicle. Within this framework, such documentation of the vehicle function, from which the vehicle function can be clearly reproduced, in particular depending on a defined driving situation of the motor vehicle, is for example transmitted. The design for the vehicle function is for example received by the second data transmission interface and from there provided to the checking circuit. The checking circuit may, for example, be provided in a development center or service center of the motor vehicle manufacturer or a workshop.

The checking circuit receives the design for the vehicle function and carries out the second permissibility check based on the predefined second permissibility criteria. In this connection, for example the checking circuit comprises artificial intelligence. The second permissibility criteria may, for example, relate to laws, industrial property rights, for example patents, regulations, for example manufacturer specifications or development guidelines, provisions, for example official authorization provisions, functional safety requirements, aspects requiring documentation, homologation-related regulations, ethical principles, or the like.

If, during the second permissibility check, the checking circuit comes to the conclusion that the design for the driving function meets the second permissibility criteria, said circuit approves the design. The approved design for the vehicle function is forwarded by means of the second data transmission interface to the motor vehicle.

The motor vehicle, for example the first data transmission interface, receives the approved design for the vehicle function and for example forwards same to the development circuit. The development circuit implements the vehicle function in the motor vehicle such that the vehicle function is available and can be executed for operation of the motor vehicle.

A method according to the teachings herein for developing a vehicle function to be executed by means of hardware of a motor vehicle may have the benefit over conventional methods for operating vehicles that a vehicle function that meets particularly stringent requirements relating to operational safety and that reduces a liability risk of the developer or, alternatively, manufacturer of the motor vehicle can be developed using simple means and in a cost-effective manner. Whereas conventional methods for operating motor vehicles by means of artificial intelligence merely cover the "system design" section of the "V-model" according to VDI 2206, the "system design" as well as the "system integration" of the "V-model" can be implemented by means of the method according to this disclosure and therefore product improvements that meet the requirements of holistic product development can be achieved.

In some embodiments, it can be provided for a checking circuit to comprise artificial intelligence that differs from the artificial intelligence of the development circuit. The artificial intelligences for example have different algorithms, such that the same problem is solved in different manners. This has the benefit that various means are provided, using simple means and in a cost-effective manner, for reaching a conclusion proceeding from a starting situation. As a result, improved verification of the result of the first permissibility check is possible by means of the second permissibility check.

According to the teachings herein, it is for example possible for second permissibility criteria to fully correspond, mostly correspond, or at least partially correspond to the first permissibility criteria to be used within the scope of the second permissibility check. For example, the same permissibility criteria are used for both permissibility checks. This is beneficial, in particular, if the development circuit and checking circuit have different artificial intelligences. This has the benefit that improved validation of the results of the first permissibility check is ensured by means of the second permissibility check using simple means and in a cost-effective manner.

In some embodiments, second permissibility criteria that differ from the first permissibility criteria are used within the scope of the second permissibility check. Within the context of the present disclosure, "different permissibility criteria" should, for example, be understood to mean different parameters and/or different levels of the same parameters. In this connection, for example the second permissibility criteria may be stricter than the first permissibility criteria. For example, the second permissibility criteria are more comprehensive than the first permissibility criteria. This has the benefit that the risk of implementing a vehicle function that causes conflict is reduced using simple means and in a cost-effective manner.

In some embodiments, in the case where the second permissibility check yields the result that the second permissibility criteria have not been met, the design for the vehicle function is modified by means of the checking circuit based on the predefined second permissibility criteria in such a way that the modified design for the vehicle function meets the second authorization criteria. For this purpose, the checking circuit is designed and configured to modify the design for the vehicle function and for example to check implementation in the motor vehicle within the scope of a simulation. The modified vehicle function is for example only sent to the development circuit for implementation if the modified vehicle function copes with a problem scenario on which the identification of the vehicle function to be developed is based or, alternatively, actually solves the problem underlying the problem scenario. This has the benefit that continuous improvement or, alternatively, extension of the vehicle functions is ensured using simple means and in a cost-effective manner. Even vehicle functions that are initially deemed impermissible are no longer automatically discarded, but rather can be implemented at least in modified form if they meet certain prerequisites.

In some embodiments, during the second permissibility check, the checking circuit only grants approval after confirmation by a control person. In this connection and in some embodiments, the submission for confirmation only takes place in the case where the checking circuit has determined that the design for the vehicle function has met the second permissibility criteria. In some embodiments, the checking circuit provides the control person with documentation relating to the design for the vehicle function. In some embodiments, the checking circuit may provide the control person with a preliminary assessment of the design for the vehicle function. An assessment of this kind for example comprises a qualitative and/or quantitative statement as to the relationship between the design for the vehicle function and the first authorization criteria and/or the second authorization criteria. For example, the final approval of the design for the vehicle function may be granted by the control person. Within the context of the present disclosure, a "control person" should be understood to mean a natural person, for example a development engineer of the motor vehicle manufacturer or an inspector of an authorizing authority, or a legal entity, for example the motor vehicle manufacturer or the authorizing authority, wherein a legal entity may also be represented by artificial intelligence. For example, approval is only granted after confirmation by a representative of the motor vehicle manufacturer and a representative of the authorizing authority. This has the benefit that a liability risk in the event of a malfunction of the motor vehicle in connection with the developed vehicle function is reduced using simple means and in a cost-effective manner.

In some embodiments, it can be provided in the method for the development circuit and/or the checking circuit to perform a hardware analysis of the hardware of the motor vehicle depending on the design for the vehicle function and, based on this, to develop a modification to the hardware in order to improve implementation of the vehicle function. Within the scope of the hardware analysis, it is for example determined how well the vehicle function can be executed by means of the available hardware and whether any modification to the hardware can improve execution of the vehicle function. In this connection, other aspects, for example manufacturing costs, number of parts variants, additional benefits, assembly effort, operational safety, service life, complexity, or the like, are for example taken into account in order to achieve a holistic improvement for the motor vehicle manufacturer. In the case of a vehicle function that provides additional illumination of a curve by means of a high-beam headlight, the hardware analysis may, for example, yield the result that the controller of the high-beam headlight must be modified in such a way that the left-hand and right-hand high-beam headlight can be actuated in a selective manner. Equally, the hardware analysis may yield the result that only partial actuation of a high-beam headlight, for example in the case of an LED headlight only a particular subset of the LEDs, is possible by means of the controller. This may potentially require a hardware modification to the high-beam headlights. This has the benefit that the development of the motor vehicle is improved using simple means and in a cost-effective manner.

In some embodiments, the approved design for the vehicle function is transmitted by means of the second data transmission interface to multiple motor vehicles. The motor vehicles for example comprise the same hardware or at least comparable hardware. In particular, the hardware required for executing the vehicle function is meant here. The vehicles may, for example, have the same type designation. This has the benefit that the development of vehicle functions is improved using simple means and in a cost-effective manner. It is sufficient for one new vehicle function that can subsequently be implemented by a large number of motor vehicles to be created by means of one motor vehicle. As a result, the motor vehicles that have not yet identified the vehicle function can also implement said vehicle function. Moreover, it is sufficient if only a subset of the motor vehicles of a vehicle type comprises a development circuit and, if necessary, additional sensors for this purpose, such that manufacturing costs can be saved for the remaining motor vehicles which have no development circuit and/or fewer sensors.

In some embodiments, the vehicle function that is to be developed may be identified in consideration of operating parameters of the motor vehicle and/or surroundings parameters of surroundings of the motor vehicle and/or environmental parameters in the environment of the motor vehicle. Operating parameters of the motor vehicle are, for example: engine/wheel rotational speed, speed, acceleration, deceleration, yaw rate, roll rate, pitch rate, steering angle, tire air pressure, cooling water temperature, cut-off angle, or the like. Surroundings parameters are, for example: road conditions, road direction, gradient, slope, obstacles, other road users, or the like. Environmental parameters are, for example: temperature, humidity, cloudiness, fog, position of the sun, ambient air pressure, precipitation intensity, type of precipitation, lying precipitation, wind direction, wind strength, or the like. This has the benefit that vehicle functions that are specially adapted to operation of the motor vehicle can be developed using simple means and in a cost-effective manner.

In some embodiments, a motor vehicle is provided that comprises a development circuit having artificial intelligence for developing a vehicle function of the motor vehicle and a first data transmission interface for transmitting data to an external receiver. This motor vehicle may for example be designed to carry out the motor vehicle-side method steps of a method according to the teachings herein.

"Motor vehicle-side method steps" should be understood to mean the method steps that are performed by means of the hardware of the motor vehicle, for example the development circuit and the first data transmission interface. Therefore, the motor vehicle may be designed to perform at least the following:
  identifying the vehicle function to be developed by means of the development circuit,
  creating the design for the vehicle function by means of the development circuit,
  carrying out the first permissibility check on the design for the vehicle function based on predefined first permissibility criteria by means of the development circuit,
  approving the design for the vehicle function for transmission by means of the development circuit if the permissibility criteria are met,
  transmitting the design for the vehicle function to the checking circuit by means of the first data transmission interface, and
  implementing the vehicle function in the motor vehicle by means of the development circuit.

In addition, the motor vehicle may be designed to receive the approved design for the vehicle function from the second data transmission interface, for example by means of the first data transmission interface. The external receiver may, for example, be designed as a second data transmission interface and be coupled to a checking circuit for data communication.

The motor vehicle may have at least some of the benefits that have already been described in relation to a method according to the teachings herein. Accordingly, this motor vehicle may have the benefit over conventional motor vehicles that a vehicle function that meets particularly stringent requirements relating to operational safety and that reduces a liability risk of the developer or, alternatively, manufacturer of the motor vehicle can be developed using simple means and in a cost-effective manner. Whereas merely the "system design" section of the "V-model" according to VDI 2206 can be covered by means of artificial intelligence with conventional motor vehicles, the "system design" as well as the "system integration" of the "V-model" can be implemented by means of the motor vehicle according to the present disclosure and therefore product improvements that meet the requirements of holistic product development can be achieved.

In the context of this discussion, the terms 'processor', 'controller', 'circuit', 'interface', and 'receiver' are understood broadly to comprise hardware and hardware/software combinations to provide the respectively discussed functionality. The respective 'processor', 'controller', 'circuit', 'interface', and/or 'receiver' may be formed integrally with each other and/or with further components. For instance, the functionality of the 'processor', 'controller', 'circuit', 'interface', and/or 'receiver' may be provided by a microprocessor, microcontroller, FPGA, or the like, with corresponding programming. The programming may be provided as software or firmware, stored in a memory, or may be provided by dedicated ('hard-wired') circuitry.

A method according to the teachings herein for developing a vehicle function to be executed by means of hardware of a motor vehicle and a motor vehicle according to the teachings herein are explained in more detail in the following based on the drawings.

Figure 2:
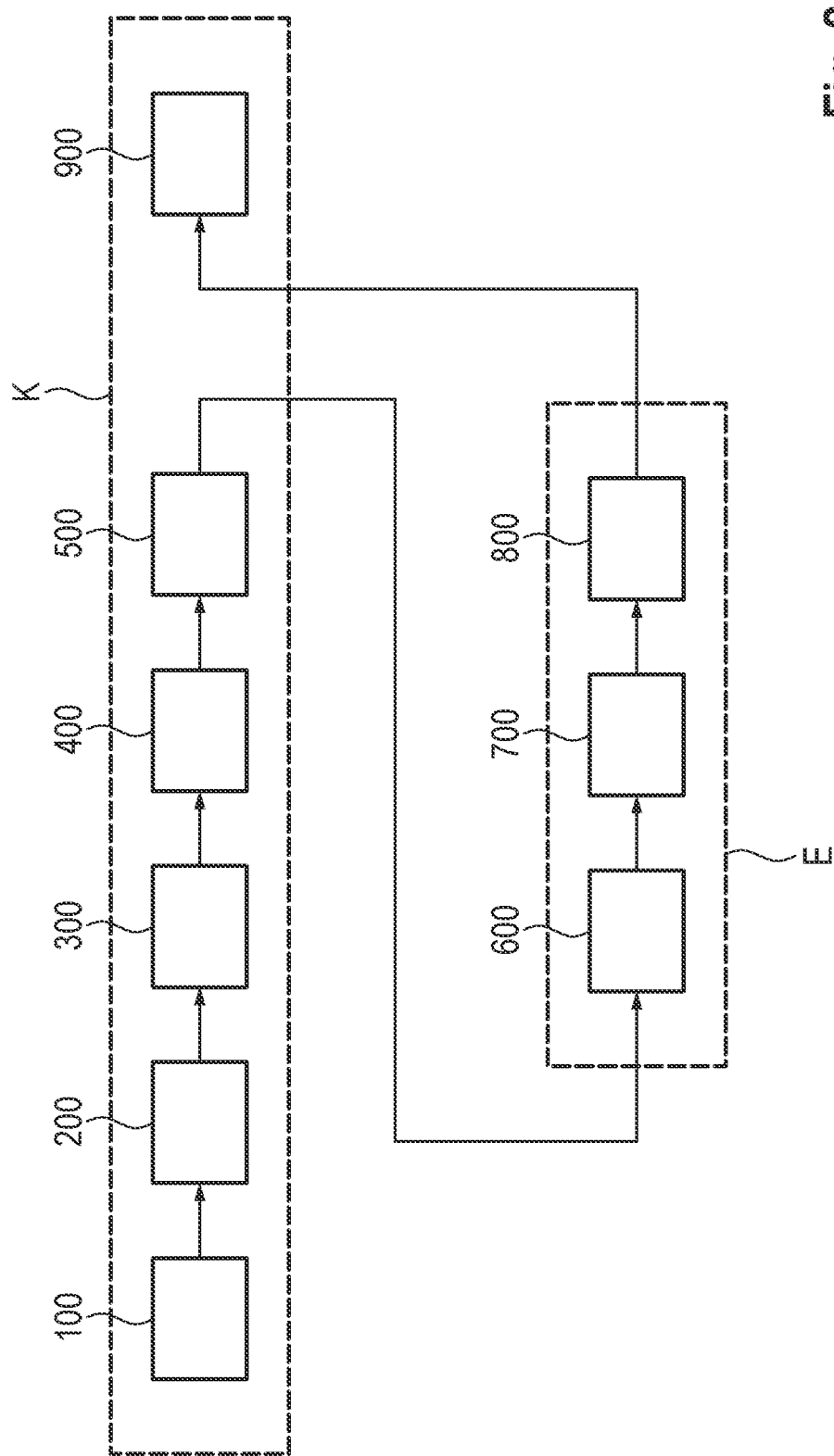
FIG. 2 is a schematic flow diagram of an embodiment of s method.
Figure 3:
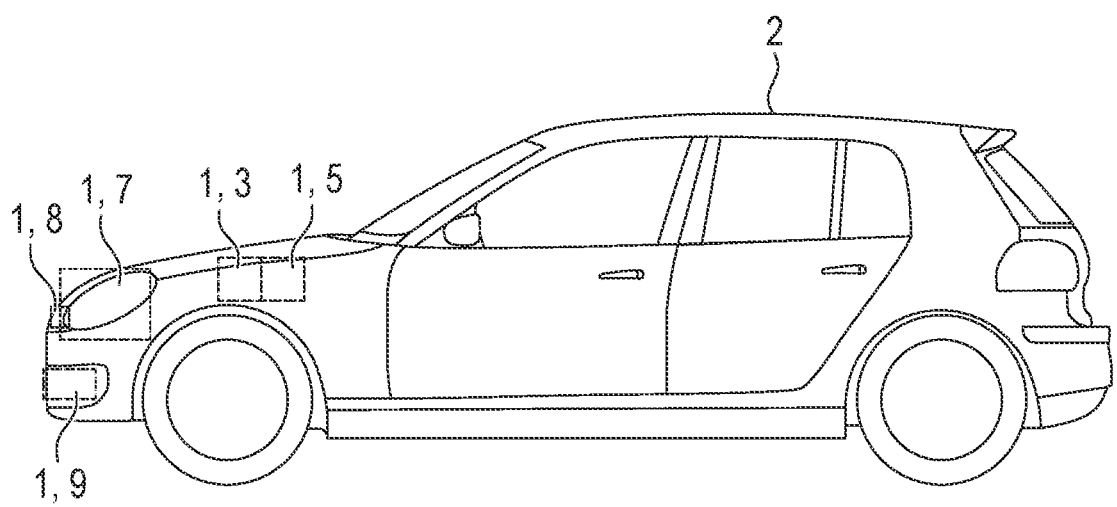
FIG. 3 is a schematic side view of an embodiment of a motor vehicle.

Elements with the same function and mode of operation have been provided with the same reference signs in each of FIGS. 1 to 3. Specific references to components, process steps, and other elements are not intended to be limiting. Further, it is understood that like parts bear the same or similar reference numerals when referring to alternate FIGS.

FIG. 1 schematically shows a V-model according to VDI 2206. Proceeding from a requirement, which corresponds to identification of the vehicle function, a system design is created and then transformed into the product, for example the implemented vehicle function, in an iterative method within the scope of system integration.

FIG. 2 schematically shows an embodiment of a method of the teachings herein in a flow diagram. In a first method step 100, a vehicle function to be developed is identified by means of artificial intelligence of a development circuit 3 of a motor vehicle 2. This for example takes place during operation of the motor vehicle 2. In a second method step 200, a design for the vehicle function is created by means of the development circuit 3. In a third method step 300, the development circuit 3 carries out a first permissibility check on the design for the vehicle function based on predefined first permissibility criteria. Within this framework, a check may for example be carried out as to whether laws, regulations, or patents have been violated. If a violation of the first permissibility criteria is found, the design for the vehicle function is for example modified in an additional method step by means of the development circuit 3. If the first authorization criteria are met, the development circuit 3 approves the design for the vehicle function in a fourth method step 400. In a fifth method step 500, the design for the vehicle function is forwarded to a checking circuit 4 remote from the motor vehicle 2 by means of a first data transmission interface 5 of the motor vehicle 2. The forwarded design for the vehicle function for example has all the data that are required for homologation.

In a sixth method step 600, the checking circuit 4 carries out a second permissibility check on the design for the vehicle function based on predefined second permissibility criteria. This for example takes place with the aid of artificial intelligence of the checking circuit 4 and/or by means of a control person. In a seventh method step 700, the design for the vehicle function is approved for transmission by means of the checking circuit 4 if the second permissibility criteria are met. In an eighth method step 800, the approved design for the vehicle function is transmitted to the motor vehicle 2 by means of a second data transmission interface 6. In a ninth method step 900, the vehicle function is implemented in the motor vehicle 2 by means of the development circuit 3. The method steps from the first method step 100 to the fifth method step 500 as well as the ninth method step 900 are also referred to as motor vehicle-side method steps K. The method steps from the sixth method step 600 to the eighth method step 800 are also referred to as external method steps E.

FIG. 3 is a schematic side view of an embodiment of a motor vehicle 2 according to present aspect. The motor vehicle 2 comprises a variety of hardware 1, for example a development circuit 3, a first data transmission interface 5, a dimmed-beam front light 7 for generating a dimmed beam in a road region lying in front of the motor vehicle 2, a sensor 8 for detecting a location-dependent light intensity in the road region, and a front fog light 9 for illuminating a road section ahead of the motor vehicle more intensely.

LIST OF REFERENCE NUMERALS

1 Hardware
2 Motor vehicle
3 Development circuit
4 Checking circuit
5 First data transmission interface
6 Second data transmission interface
7 Dimmed-beam front light
8 Sensor
9 Front fog light
100 First method step
200 Second method step
300 Third method step
400 Fourth method step
500 Fifth method step
600 Sixth method step
700 Seventh method step
800 Eighth method step
900 Ninth method step
K Motor vehicle-side method steps
E External method steps The invention has been described in the preceding using various exemplary embodiments. Other variations to the disclosed embodiments may be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The term "exemplary" used throughout the specification means "serving as an example, instance, or exemplification" and does not mean "preferred" or "having advantages" over other embodiments. The term "in particular" and "particularly" used throughout the specification means "for example" or "for instance".

The mere fact that certain measures are recited in mutually different dependent claims or embodiments does not indicate that a combination of these measures cannot be used to advantage. Any reference signs in the claims should not be construed as limiting the scope.

What is claimed is:

1. A method for developing a vehicle function to be executed using hardware of a motor vehicle, the vehicle function comprising targeted illumination of a region arranged ahead of a front side of the motor vehicle using a lighting device of the motor vehicle, the method comprising:
   identifying the vehicle function to be developed using a development circuit of the motor vehicle, wherein the development circuit comprises artificial intelligence;
   creating a design for the vehicle function using the development circuit;
   carrying out a first permissibility check on the design for the vehicle function based on predefined first permissibility criteria using the development circuit of the motor vehicle;
   approving the design for the vehicle function for transmission, to a checking circuit that is remote from the motor vehicle, using the development circuit, and if the first permissibility criteria are met;
   transmitting the design for the vehicle function, as approved by the development circuit of the motor vehicle, to the checking circuit that is remote from the motor vehicle using a first data transmission interface of the motor vehicle;
   carrying out a second permissibility check on the design for the vehicle function based on predefined second permissibility criteria using the checking circuit;
   approving the design for the vehicle function for transmission using the checking circuit if the second permissibility criteria are met;
   transmitting the approved design for the vehicle function to the motor vehicle using a second data transmission interface; and
   implementing the vehicle function in the motor vehicle using the development circuit.

2. The method of claim 1, wherein the checking circuit has artificial intelligence that differs from the artificial intelligence of the development circuit.

3. The method of claim 2, wherein second permissibility criteria that fully correspond, mostly correspond, or at least partially correspond to the first permissibility criteria are used within the scope of the second permissibility check.

4. The method of claim 2, wherein second permissibility criteria that differ from the first permissibility criteria are used within the scope of the second permissibility check.

5. The method of claim 2, wherein, in the case where the second permissibility check yields the result that the second permissibility criteria have not been met, the design for the vehicle function is modified using the checking circuit based on the predefined second permissibility criteria in such a way that the modified design for the vehicle function meets the second authorization criteria.

6. The method of claim 2, wherein, during the second permissibility check, the checking circuit only grants approval after confirmation by a control person.

7. The method of claim 2, wherein the development circuit and/or the checking circuit performs a hardware analysis of the hardware of the motor vehicle depending on the design for the vehicle function and, based on this, develops a modification to the hardware in order to improve implementation of the vehicle function.

8. The method of claim 1, wherein second permissibility criteria that fully correspond, mostly correspond, or at least partially correspond to the first permissibility criteria are used within the scope of the second permissibility check.

9. The method of claim 8, wherein, in the case where the second permissibility check yields the result that the second permissibility criteria have not been met, the design for the vehicle function is modified using the checking circuit based on the predefined second permissibility criteria in such a way that the modified design for the vehicle function meets the second authorization criteria.

10. The method of claim 8, wherein, during the second permissibility check, the checking circuit only grants approval after confirmation by a control person.

11. The method of claim 1, wherein second permissibility criteria that differ from the first permissibility criteria are used within the scope of the second permissibility check.

12. The method of claim 11, wherein, in the case where the second permissibility check yields the result that the second permissibility criteria have not been met, the design for the vehicle function is modified using the checking circuit based on the predefined second permissibility criteria in such a way that the modified design for the vehicle function meets the second authorization criteria.

13. The method of claim 11, wherein, during the second permissibility check, the checking circuit only grants approval after confirmation by a control person.

14. The method of claim 1, wherein, in the case where the second permissibility check yields the result that the second permissibility criteria have not been met, the design for the vehicle function is modified using the checking circuit based on the predefined second permissibility criteria in such a way that the modified design for the vehicle function meets the second authorization criteria.

15. The method of claim 14, wherein, during the second permissibility check, the checking circuit only grants approval after confirmation by a control person.

16. The method of claim 1, wherein, during the second permissibility check, the checking circuit only grants approval after confirmation by a control person.

17. The method of claim 1, wherein the development circuit and/or the checking circuit performs a hardware analysis of the hardware of the motor vehicle depending on the design for the vehicle function and, based on this, develops a modification to the hardware in order to improve implementation of the vehicle function.

18. The method of claim 1, wherein the approved design for the vehicle function is transmitted using the second data transmission interface to multiple motor vehicles.

19. The method of claim 1, wherein the vehicle function to be developed is identified in consideration of operating parameters of the motor vehicle and/or surroundings parameters of surroundings of the motor vehicle and/or environmental parameters in the environment of the motor vehicle.

20. A motor vehicle, comprising a development circuit having artificial intelligence for developing a vehicle function of the motor vehicle and a first data transmission interface for transmitting data to an external receiver, the vehicle function comprising targeted illumination of a region arranged ahead of a front side of the motor vehicle using a lighting device of the motor vehicle, wherein the motor vehicle is configured to:
  identify a vehicle function to be developed using a development circuit of the motor vehicle, wherein the development circuit comprises artificial intelligence;
  create a design for the vehicle function using the development circuit;
  carry out a first permissibility check on the design for the vehicle function based on predefined first permissibility criteria using the development circuit of the motor vehicle;
  approve the design for the vehicle function for transmission, to a checking circuit that is remote from the motor vehicle, using the development circuit, and if the first permissibility criteria are met;
  transmit the design for the vehicle function, as approved by the development circuit of the motor vehicle, to the checking circuit that is remote from the motor vehicle using a first data transmission interface of the motor vehicle;
  carry out a second permissibility check on the design for the vehicle function based on predefined second permissibility criteria using the checking circuit;
  approve the design for the vehicle function for transmission using the checking circuit if the second permissibility criteria are met;
  transmit the approved design for the vehicle function to the motor vehicle using a second data transmission interface; and
  implement the vehicle function in the motor vehicle using the development circuit.

* * * * *